United States Patent
Peters (10) Patent No.: US 11,189,988 B2
(45) Date of Patent: Nov. 30, 2021

(54) ELECTRICALLY ISOLATING VERTICAL-EMITTING DEVICES

(71) Applicant: Lumentum Operations LLC, Milpitas, CA (US)

(72) Inventor: Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 114 days.

(21) Appl. No.: 16/587,565

(22) Filed: Sep. 30, 2019

(65) Prior Publication Data
US 2020/0388986 A1 Dec. 10, 2020

Related U.S. Application Data
(60) Provisional application No. 62/859,501, filed on Jun. 10, 2019.

(51) Int. Cl.
| | | |
|---|---|---|
| *H01S 5/02* | (2006.01) | |
| *H01S 5/042* | (2006.01) | |
| *H01S 5/42* | (2006.01) | |

(52) U.S. Cl.
CPC ......... *H01S 5/0208* (2013.01); *H01S 5/0425* (2013.01); *H01S 5/423* (2013.01)

(58) Field of Classification Search
CPC ......... H01S 5/0208; H01S 5/42; H01S 5/0425
USPC ......................................................... 372/33
See application file for complete search history.

(56) References Cited

U.S. PATENT DOCUMENTS

| | | | | |
|---|---|---|---|---|
| 9,076,664 | B2* | 7/2015 | Pelley | H01L 25/0657 |
| 10,102,805 | B2* | 10/2018 | Yang | G09G 3/2003 |
| 2010/0261297 | A1* | 10/2010 | Trezza | H01L 21/76898 |
| | | | | 438/15 |
| 2012/0034739 | A1* | 2/2012 | Trezza | H01L 25/0657 |
| | | | | 438/107 |
| 2013/0026625 | A1* | 1/2013 | Mah | H01L 24/16 |
| | | | | 257/737 |
| 2013/0087926 | A1* | 4/2013 | Pelley | H01L 25/0657 |
| | | | | 257/774 |
| 2015/0145124 | A1* | 5/2015 | Kang | H01L 23/481 |
| | | | | 257/737 |
| 2016/0141839 | A1* | 5/2016 | Matsubara | H01S 5/4018 |
| | | | | 372/38.05 |

OTHER PUBLICATIONS

Sammy Kayali et al., "GaAs MMIC Reliability Assurance Guideline forSpace Applications", https://parts.jpl.nasa.gov/mmic/mmic_complete.pdf, Dec. 15, 1996, JPL Publication 96-25, 221 pages.

* cited by examiner

*Primary Examiner* — Tuan N Nguyen
(74) *Attorney, Agent, or Firm* — Harrity & Harrity, LLP (57) ABSTRACT

A device includes a substrate, a vertical cavity surface emitting laser (VCSEL) array on top of the substrate, a via through the substrate and the VCSEL array, a first electrode extended from a top of the VCSEL array to a bottom of the substrate, through the via, the first electrode electrically connected to the VCSEL array, a second electrode on the bottom of the substrate, the second electrode electrically connected to the VCSEL array, and an isolator in the via providing electrical isolation between the first electrode and the second electrode.

20 Claims, 6 Drawing Sheets

ELECTRICALLY ISOLATING VERTICAL-EMITTING DEVICES

RELATED APPLICATION(S)

This application claims priority to U.S. Provisional Application No. 62/859,501, filed on Jun. 10, 2019, and entitled "VIAS FOR TOP-EMITTING VERTICAL CAVITY SURFACE EMITTING LASER (VCSEL) EMITTERS," the content of which is incorporated by reference herein in its entirety.

TECHNICAL FIELD

The present disclosure relates to electrical isolation of vertical-emitting devices and, more particularly, to use of an isolator to electrically isolate the vertical-emitting devices.

BACKGROUND

A vertical-emitting device, such as a vertical cavity surface emitting laser (VCSEL), may include a laser, an optical transmitter, and/or the like in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

According to some implementations, a device includes a substrate, a vertical cavity surface emitting laser (VCSEL) array on top of the substrate, a via through the substrate and the VCSEL array, a first electrode extended from a top of the VCSEL array to a bottom of the substrate, through the via, the first electrode electrically connected to the VCSEL array, a second electrode on the bottom of the substrate, the second electrode electrically connected to the VCSEL array, and an isolator in the via providing electrical isolation between the first electrode and the second electrode.

According to some implementations, a device includes a non-conductive substrate, a VCSEL array on top of the substrate, a first via through the substrate and the VCSEL array, a second via through the substrate and the VCSEL array, a first electrode extended from a top of the VCSEL array to a bottom of the substrate, through the first via, the first electrode electrically connected to the VCSEL array, a second electrode extended from the top of the VCSEL array to the bottom of the substrate, through the second via, the second electrode electrically connected to the VCSEL array, and an isolator in the first via providing electrical isolation between the first electrode and the second electrode.

According to some implementations, a method of forming a device includes forming a VCSEL array on top of a substrate of the device, forming a via through the substrate and the VCSEL array, forming a first electrode extended from a top of the VCSEL array to a bottom of the substrate, through the via, the first electrode electrically connected to the VCSEL array, forming a second electrode on the bottom of the substrate, the second electrode electrically connected to the VCSEL array, and forming an isolator in the via providing electrical isolation between the first electrode and the second electrode.

DETAILED DESCRIPTION

The following detailed description of example implementations refers to the accompanying drawings. The same reference numbers in different drawings may identify the same or similar elements.

A vertical-emitting device (e.g., a vertical cavity surface emitting laser (VCSEL) device) may include one or more VCSELs or other types of vertical-emitting lasers, optical transmitters, and/or the like. An electrical current may be provided to the one or more VCSELs by an anode electrically connected to the one or more VCSELs, and may be carried away from the one or more VCSELs by a cathode electrically connected to the one or more VCSELs.

In some cases, the anode may be located on a top side of a substrate of the vertical-emitting device, and the cathode may be located on a bottom side of the substrate, such that the electrical current flows through the substrate from the anode to the cathode. In this case, the vertical-emitting device may be electrically connected to a package by wire-bonding the anode (or the anode and the cathode) to the package, which may increase the size of the overall packaged vertical-emitting device, may increase rise and fall times of the one or more VCSELs included in the vertical-emitting device under short pulsed (e.g., less than one microsecond) operation, may increase the complexity of packaging the vertical-emitting device, may decrease the reliability of the packaged vertical-emitting device, and/or the like.

Some implementations described herein provide various examples of a vertical-emitting device in which an anode and a cathode are located on a bottom-side of a substrate of the vertical-emitting device. The anode, or the anode and the cathode, of a vertical-emitting device may extend from the bottom side of the substrate to a top side of the substrate through a via through the substrate and/or one or more epitaxial layers formed on the substrate. An electrical isolator may be formed in and/or on at least a portion of the walls of the via to electrically isolate the anode from the substrate and one or more epitaxial layers to reduce or prevent lateral conduction through the substrate and the one or more epitaxial layers between the anode in the via and the cathode. In this way, the vertical-emitting device may be electrically connected to a package by directly bonding the anode and the cathode to a modular substrate or to a package. The direct bonding permits the vertical-emitting device to be electrically connected to the package without wire bonds, which may decrease the size of the overall packaged vertical-emitting device, may decrease rise and fall times of the one or more VCSELs included in the vertical-emitting device under short pulsed operation (e.g., which may improve the performance of various vertical-emitting applications, such as three-dimensional sensing applications and/or the like), may decrease the complexity of packaging the vertical-emitting device, may increase the reliability of the packaged vertical-emitting device, and/or the like.

Figure 1:
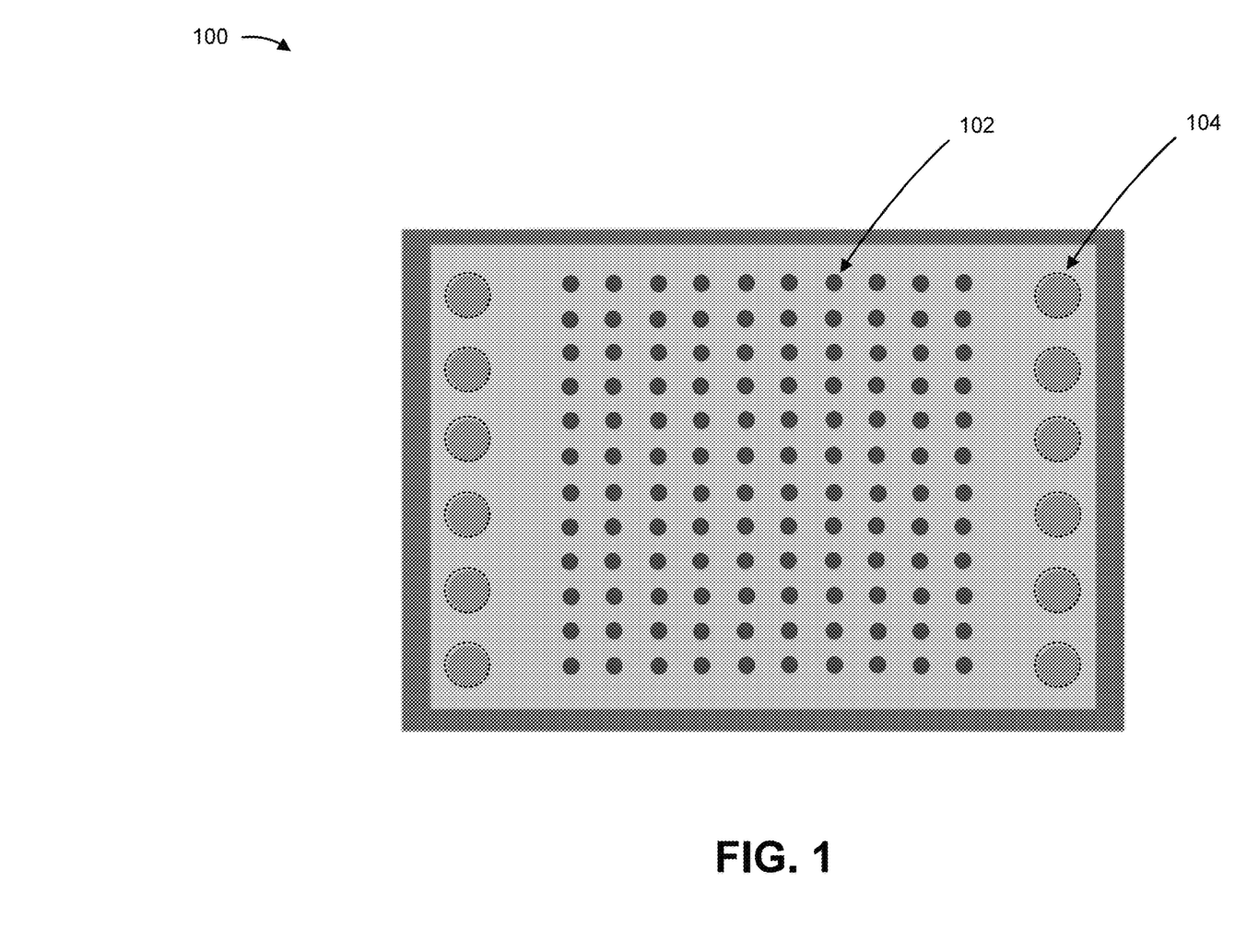
FIG. 1 illustrates a top-down view of a device that includes one or more vertical cavity surface emitting lasers (VCSELs) and one or more vias.

FIG. 1 illustrates a top-down view of an example device 100. Device 100 may include a vertical-emitting device, such as a vertical-emitting optical device, a vertical-emitting optical system, a VCSEL device, and/or the like. Device 100 may include one or more VCSELs 102 and/or other types of vertical emitters and one or more vias 104. In some implementations, device 100 may include a plurality of VCSELs 102 in a VCSELs array. In some implementations, device 100 may include a single VCSEL 102 and/or a single via 104. In some implementations, vias 104 may permit a first electrode and a second electrode (e.g., an anode and a cathode), electrically connected to VCSELs 102, to be located on a bottom side of device 100 such that device 100 may be directly bonded to a package (e.g., without wire bonds).

In some implementations, each via 104 may be associated with a respective VCSEL 102. In some implementations, a via 104 may be associated with a plurality of VCSELs 102. In this case, a via 104 may be associated with all of the VCSELs 102 included in device 100 or a subset of the VCSELs 102 included in device 100. Vias 104 are illustrated in dashed lines to indicate that vias 104 may not be visible in the top-down view of device 100.

Figure 2A:
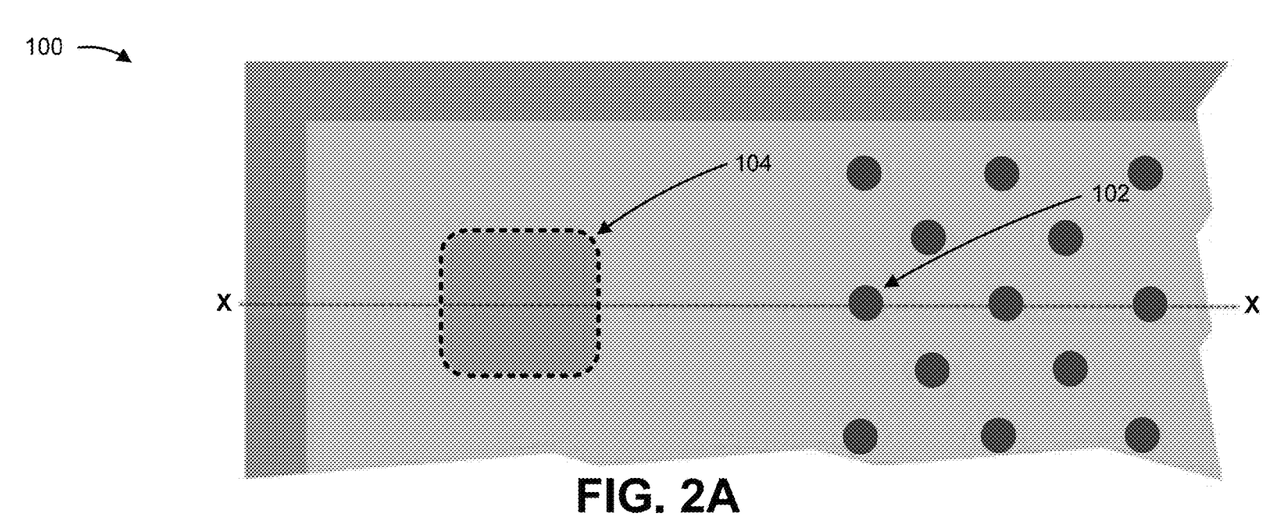
FIGS. 2A-2B are diagrams depicting another top-down view and an example cross-sectional view of the example device illustrated in FIG. 1.
Figure 2B:
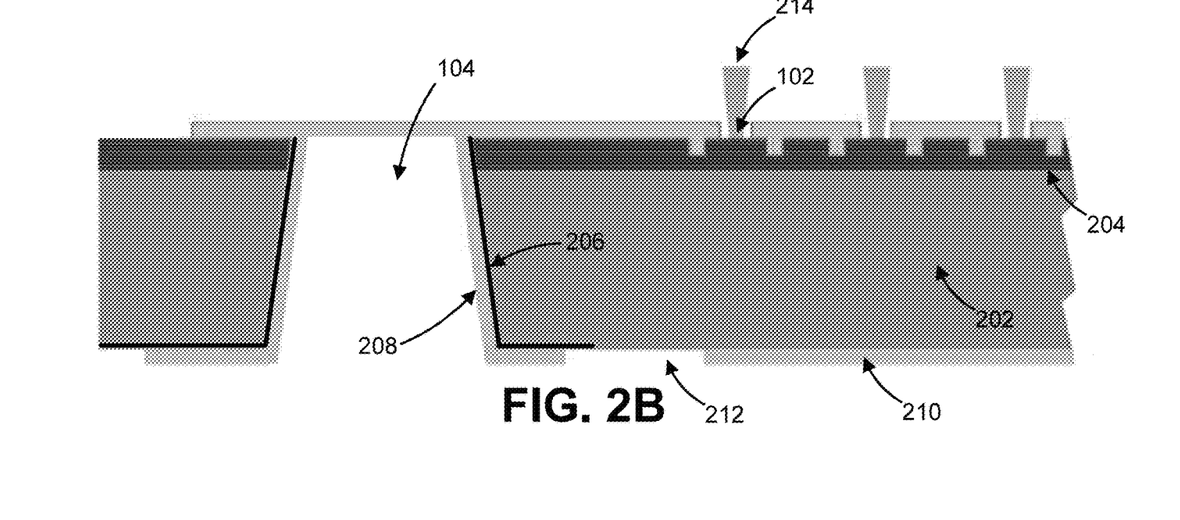

FIGS. 2A and 2B illustrate a top-down view and a cross-sectional view along line XX, respectively, of a portion of device 100 that includes a via 104 and one or more VCSELs 102. As shown in FIG. 2B, VCSELs 102 may be formed on top of a substrate 202 included in device 100. Substrate 202 may be formed of various semiconducting materials, such as III-V semiconductors (e.g., gallium arsenide (GaAs), indium gallium arsenide (InGaAs), indium phosphide (InP), and/or the like), IV semiconductors (e.g., silicon (Si) and/or the like), and/or the like. In some implementations, substrate 202 may be doped using various materials to form an n-type or p-type substrate, such as a p-doped GaAs or n-doped GaAs substrate, a p-doped InGaAs or n-doped InGaAs substrate, a p-doped InP or n-doped InP substrate, and/or the like.

As further shown in FIG. 2B, device 100 may include one or more epitaxial layers 204 formed on substrate 202. For example, epitaxial layers 204 may include one or more n-doped epitaxial layers, which may include n-doped distributed Bragg reflector (n-DBR) layers and/or an N+ doped buffer layer. The n-DBR layers may include alternating layers of n-doped gallium arsenide (n-GaAs) and n-doped aluminum gallium arsenide (n-AlGaAs). The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems because the aluminum in the n-AlGaAs layer can oxidize and create a poor ohmic contact. As a result, some implementations may include an N+ doped buffer layer.

In some implementations, epitaxial layers 204 may include one or more p-doped epitaxial layers formed on the n-doped epitaxial layers (e.g., p-doped distributed Bragg reflector (p-DBR) layers). The p-doped epitaxial layers and n-doped epitaxial layers 204 may form mirrors of a vertical cavity of VCSELs 102.

In some implementations, VCSELs 102 may include one or more active layers, which may separate portions of the p-doped epitaxial layers and the n-doped epitaxial layers. For example, the active layer(s) may be a layer of VCSELs 102 where optical gain for VCSELs 102 is generated. In some implementations, the p-doped epitaxial layers may include one or more oxidation areas to resist electrical flow from a top portion of an anode 208 electrically connected to VCSELs 102 (e.g., a portion of anode 208 formed above the one or more epitaxial layers 204 on substrate 202). Anode 208 may be a source of electrical flow into VCSELs 102, and may be a shared electrode for all VCSELs 102. In this case, VCSELs 102 may be electrically connected in parallel to anode 208. Anode 208 may contact the p-doped epitaxial layers of epitaxial layers 204. Moreover, the oxidation areas may guide the electrical flow through an oxidation aperture, through an active region of the active layer(s), and toward the n-doped epitaxial layers of epitaxial layers 204.

In some implementations, VCSELs 102 may include a dielectric layer. The dielectric layer may include an aperture region where light 214 is emitted from VCSELs 102.

As further shown in FIG. 2B, VCSELs 102 may include a cathode 210, which may be located on a backside or bottom side of substrate 202. Cathode 210 may include a metallized and/or conductive layer (e.g., solder metallization, gold plating, silver plating, copper plating, and/or the like) that serves as a point of egress for electrical flow from VCSELs 102. In some implementations, the electrical polarity VCSELs 102 may be reversed, in which case anode 208 depicted in FIG. 2B may be a cathode, and cathode 210 depicted in FIG. 2B may be an anode, in which case the cathode may be a common cathode for all VCSELs 102.

In some implementations, via 104 may be through substrate 202 and the epitaxial layers 204 (e.g., etched through or formed by another processing technique). Via 104 may electrically connect a bottom portion of the metallization and/or conductive layer of anode 208 (e.g., a portion of anode 208 located on a bottom side of substrate 202) and the top portion of the metallization and/or conductive layer of anode 208. In this case, the metallization and/or conductive layer of anode 208 may be formed in via 104 (e.g., on the sidewalls of via 104) such that the bottom portion of anode 208 electrically connects to the top portion of anode 208 in via 104 and such that current flows from the bottom portion of anode 208 to the top portion of anode 208. In this way, anode 208 extends from the bottom side of substrate 202 to the top side of substrate 202 and the epitaxial layers 204 through via 104.

In some implementations, via 104 may be a backside or bottom side via in that via 104 may be etched through substrate 202 from the backside or bottom side of substrate 202. In some implementations, via 104 may be a top side via in that via 104 may be etched through substrate 202 from the top side of substrate 202. Via 104 may also be formed by other methods.

In some cases, the metallization of the sidewalls in vias 104, and the semiconducting or conducting nature of substrate 202, may cause shorting between electrodes of VCSELs 102 of device 100. For example, electrical current may horizontally or laterally traverse or flow from anode 208 in via 104 and/or on the bottom of substrate 202 through substrate 202, through epitaxial layers 204, and/or through other layers of device 100 to cathode 210 (e.g. without, or with reduced, electrical current passing through VCSELs 102).

Accordingly, and as shown in FIG. 2B, device 100 may include an isolator 206 between the metallization and/or conductive layer of anode 208 and both substrate 202 and epitaxial layers 204. Isolator 206 may include a layer, a structure, a material, and/or the like, provide horizontal or lateral electrical isolation between anode 208 and cathode 210 by preventing current flow or shorting through substrate 202 and epitaxial layers 204 thereby encouraging current flow through VCSELs 102. Moreover, device 100 may include a gap 212 between the bottom portion of anode 208 and cathode 210 to electrically isolate anode 208 and cathode 210 in order to prevent shorting between anode 208 and cathode 210 (e.g. reduce potential for shorting the two electrodes when device 100 is attached to a package).

In some implementations, isolator 206 may be formed on the sidewalls of via 104, may be formed on at least a portion of the bottom of substrate 202, and/or the like. For example, isolator 206 may be formed between substrate 202 and anode 208, between epitaxial layers 204 and anode 208, and/or the like anywhere anode 208 is formed in via 208. As another example, isolator 206 may be formed anywhere anode 208 is formed on the bottom of substrate 208. In some implementations, isolator 206 may extend a distance along the bottom of substrate 202 past where anode 208 is formed on the bottom of substrate 202. In some implementations, isolator 206 may extend along a side of VCSELs 102 (e.g., along the side of a VCSEL 102, along a side of a VCSEL array including VCSELs 102, and/or the like) and a side of substrate 202 through via 104 and over the bottom of substrate 202.

In some implementations, isolator 206 may be deposited on substrate 202 and epitaxial layers 204, may be grown on substrate 202 and epitaxial layers 204, may be implanted in substrate 202 and epitaxial layers 204 (an VCSELs 102), and/or may be formed by other processing techniques. In some implementations, isolator 206 may be formed by an implantation technique that includes using protons or ions, such as hydrogen ions, hydrogen protons, boron ions, oxygen ions, and/or the like, to damage or change an area of substrate 202, epitaxial layers 204, and within a side of VCSELs 102 (e.g., a VCSEL 102, a VCSEL array including VCSELs 102, and/or the like). The implantation technique may change or damage an area of substrate 202 and epitaxial layers 204 so that the area of substrate 202 and epitaxial layers 204 is no longer electrically conductive (e.g., may form a highly electrically resistive area, a non-conductive area, a poorly conductive area, and/or the like).

In some implementations, isolator 206 may be formed of various non-conductive materials and/or insulating materials, such as a dielectric material, a polymer, a passivated semiconductor, and/or the like. In some implementations, the dielectric material may include silicon nitride, silicon dioxide, aluminum oxide, and/or other dielectric materials. In some implementations, the polymer may include a polyamide, a benzocyclobutene polymer, and/or other types of polymers.

In this way, anode 208 and cathode 210 may be located on the bottom side of substrate 202 of device 100. Via 104 may extend anode 208 from the bottom side of substrate 202 to the top side of substrate 202 and epitaxial layers 204. Isolator 206 may be formed on at least a portion of the walls of via 104 to electrically isolate anode 208 from cathode 210, substrate 202, and epitaxial layers 204 in order to reduce or prevent horizontal or lateral conduction through substrate 202 and epitaxial layers 204 between anode 208 in via 104 and cathode 210. In this way, device 100 may be electrically connected to a package by directly bonding anode 208 and cathode 210 to a modular substrate of the package. The direct bonding permits device 100 to be electrically connected to the package without wire bonds, which may decrease the size of the overall packaged device 100, may decrease rise and fall times of VCSELs 102 included in device 100 under short pulsed operation, may decrease the complexity of packaged device 100, may increase the reliability of packaged device 100, and/or the like.

As indicated above, FIGS. 1, 2A, and 2B are provided merely as one or more examples. Other examples are contemplated and may differ from what is described with regard to FIGS. 1, 2A, and 2B. For example, while FIGS. 1, 2A, and 2B are described in connection with VCSELs, the example implementations described in connection with FIGS. 1, 2A, and 2B may include vertical-emitting light emitting diodes (LEDs) and/or other types of vertical-emitting devices, may include vertical-emitting LED arrays and/or other types of vertical-emitting device arrays, and/or the like. As another example, the example implementations described in connection with FIGS. 1, 2A, and 2B may include a single VCSEL or a plurality of VCSELs (which may be included in one or more VCSEL arrays), may include a single via or a plurality of vias (which may be included in one or more via arrays), and/or the like.

Figure 3:
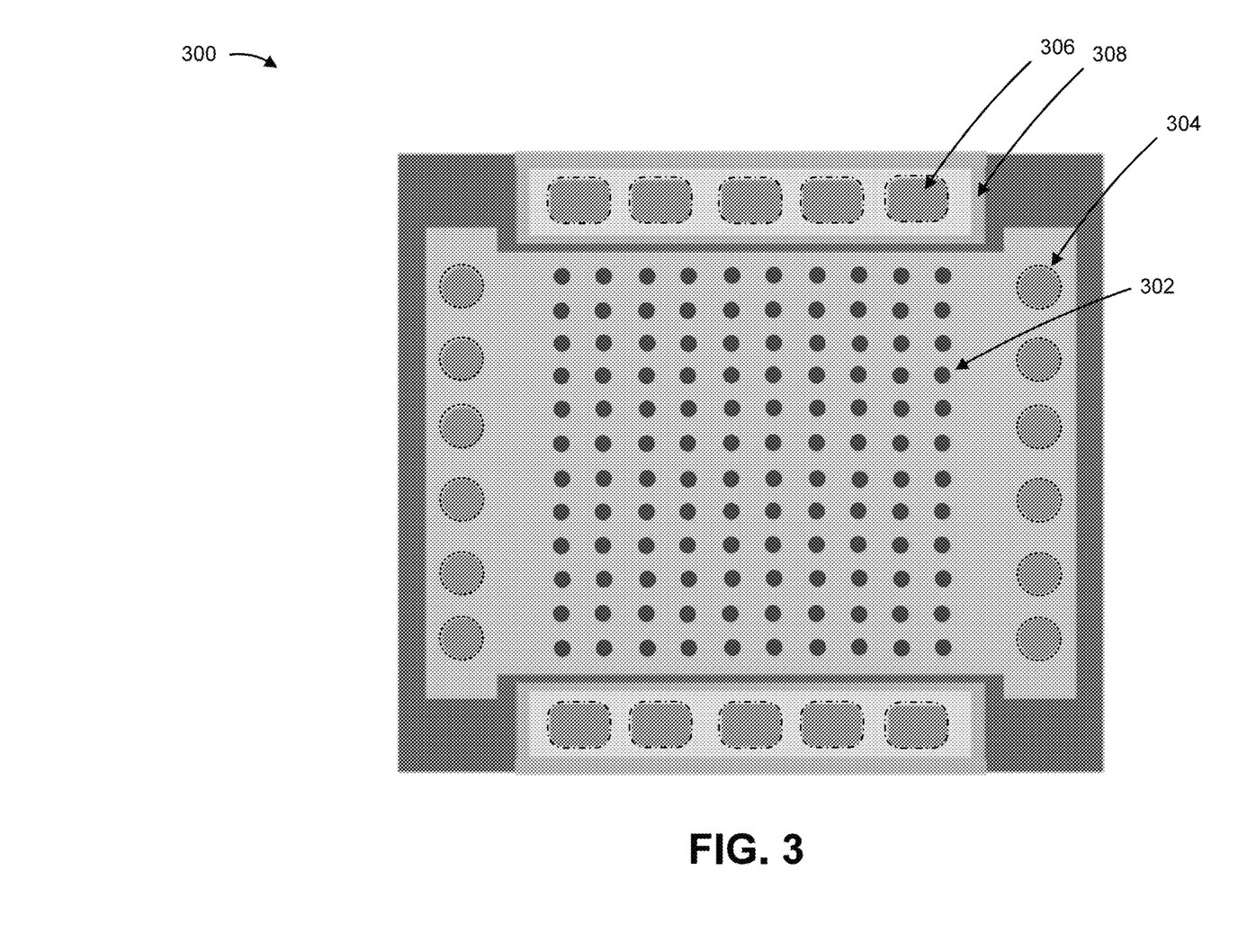
FIG. 3 illustrates a top-down view of a device that includes one or more VCSELs and one or more vias of two types.
Figure 4A:
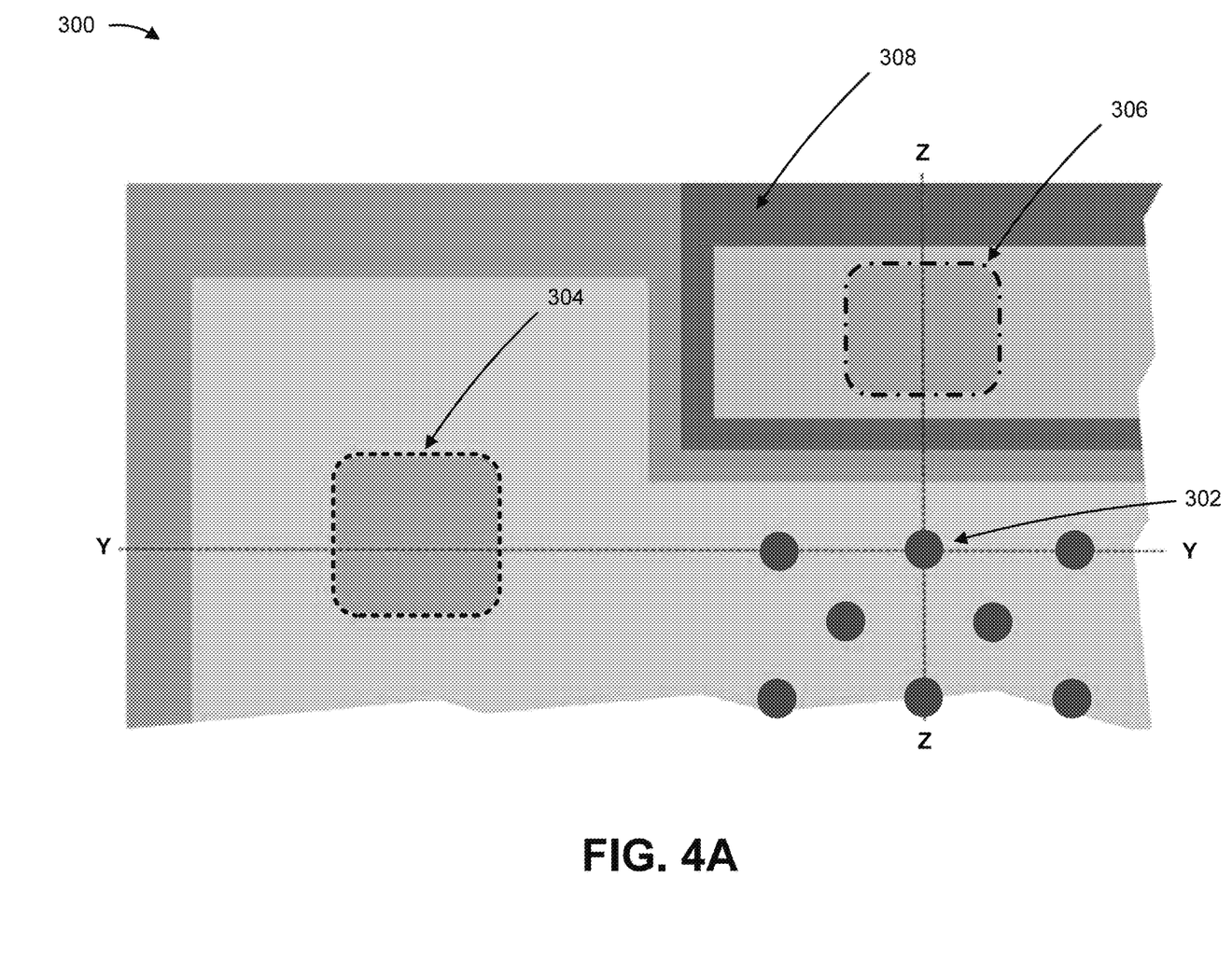
FIG. 4A is a diagram depicting another top-down view of the example device illustrated in FIG. 3.

FIGS. 3 and 4A illustrate top-down views of an example device 300 and a portion thereof. Device 300 may include a vertical-emitting device, such as a vertical-emitting optical device, a vertical-emitting optical system, a VCSEL device, and/or the like. Device 300 may include one or more VCSELs 302 and/or other types of vertical emitters. Moreover, device 300 may include one or more vias 304 and one or more vias 306. In some implementations, device 300 may include a single VCSEL 302, a single via 304, and/or a single via 306. In some implementations, device 300 may include a plurality of VCSELs 302 in a VCSEL array.

In some implementations, via 304 may be an anode via (e.g., a via to extend an anode of device 300 from a bottom side of a substrate of device 300 to a top side of the substrate of device 300). In some implementations, the substrate may be a non-conductive and/or insulating substrate. In this case, via 306 may be a cathode via (e.g., a via to extend a cathode from a bottom side of the substrate of device 300 to the top side of the substrate of device 300). In some implementations, vias 304 and vias 306 may permit the anode and the cathode, electrically connected to VCSELs 302, to be located on a bottom side of device 300 such that device 300 may be directly bonded to a package (e.g., without wire bonds).

As further shown in FIGS. 3 and 4A, an area 308 may be formed on device 300 in which at least a portion of a p-type epitaxial layer is removed (e.g., by etching and/or another processing technique) to prevent shorting between the p-type epitaxial layer and the cathode.

In some implementations, each via 304 and via 306 may be associated with a respective VCSEL 302. In some implementations, a via 304 and/or a via 306 may be associated with a plurality of VCSELs 302. In this case, a via 304 and/or a via 306 may be associated with all of the VCSELs 302 included in device 300 or a subset of the VCSELs 302 included in device 300. Vias 304 and vias 306 are illustrated in dashed lines to indicate that vias 304 and vias 306 may not be visible in the top-down view of device 300.

Figure 4B:
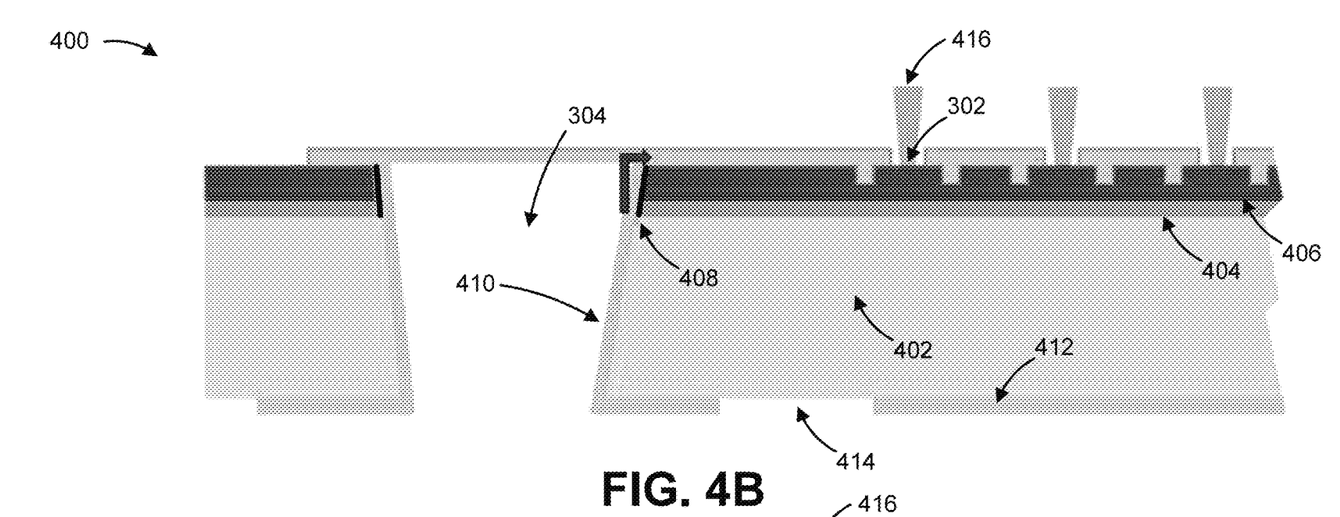
FIGS. 4B and 4C are diagrams depicting example cross-sectional views of the example device illustrated in FIG. 3.
Figure 4C:
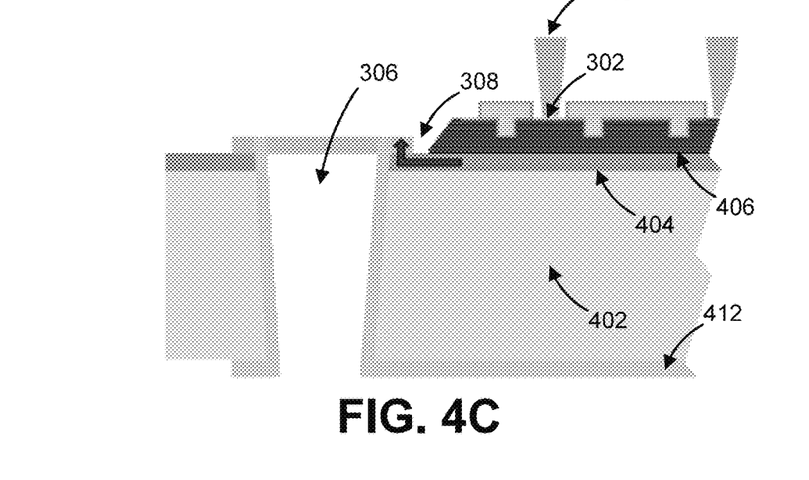

FIGS. 4B and 4C illustrate cross-sectional views along lines YY and ZZ, respectively, as shown in FIG. 4A, of a portion of device 300 that includes a via 304, via 306, and one or more VCSELs 302. As shown in FIGS. 4B and 4C, VCSELs 302 may be formed on top of a substrate 402 included in device 300. Substrate 402 may be formed of various non-conductive and/or insulating materials, such as an insulating GaAs material, an insulating InGaAs material, an insulating indium phosphide InP material, and/or the like.

As further shown in FIGS. 4B and 4C, device 400 may include one or more n-doped epitaxial layers 404 formed on substrate 402. For example, the n-doped epitaxial layers 404 may include n-DBR layers and/or an N+ doped buffer layer. The n-DBR layers may include alternating layers of n-GaAs and n-AlGaAs. The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems, because the aluminum in the n-AlGaAs layer can oxidize and create a poor ohmic contact. As a result, some implementations may include an N+ doped buffer layer.

As further shown in FIGS. 4B and 4C, device 400 may include one or more p-doped epitaxial layers 406 formed on n-doped epitaxial layers 404 (e.g., p-DBR layers). P-doped epitaxial layers 406 and n-doped epitaxial layers 404 may form mirrors of a vertical cavity of VCSELs 302.

In some implementations, VCSELs 302 may include one or more active layers, which may separate portions of p-doped epitaxial layers 406 and n-doped epitaxial layers 404. For example, the active layer(s) may be a layer of VCSELs 302 where optical gain for VCSELs 302 is generated. In some implementations, the p-doped epitaxial layers may include one or more oxidation areas to resist electrical flow from a top portion of an anode 410 electrically connected to VCSELs 302 (e.g., a portion of anode 410 formed above p-doped epitaxial layers 406 and n-doped epitaxial layers 404 on substrate 402). Anode 410 may be a source of electrical flow into VCSELs 302, and may be a shared electrode for all VCSELs 302. In this case, VCSELs 302 may be electrically connected in parallel to anode 410. Anode 410 may contact p-doped epitaxial layers 406 such that current flows through VCSELs 302 to p-doped epitaxial layers 406. Moreover, the oxidation areas may guide the electrical flow through an oxidation aperture, through an active region of the active layer(s), and toward n-doped epitaxial layers 404.

In some implementations, VCSELs 302 may include a dielectric layer. The dielectric layer may include an aperture region where light 416 is emitted from VCSELs 302.

As further shown in FIGS. 4A and 4B, VCSELs 302 may include a cathode 412, which may be located on a backside or bottom side of substrate 402. Cathode 412 may include a metallized and/or conductive layer (e.g., solder metallization, gold plating, silver plating, copper plating, and/or the like) that serves as a point of egress for electrical flow from VCSELs 302. Cathode 412 may electrically connect to n-doped epitaxial layers 404, in which case cathode 412 may be located between VCSELs 302 and substrate 402. In some implementations, the electrical polarity of VCSELs 302 may be reversed, in which case anode 410 depicted in FIG. 4A may be a common cathode for all VCSELs 320, and cathode 412 depicted in FIGS. 4A and 4B may be an anode.

In some implementations, via 304 may be through substrate 402 and the epitaxial layers 404 and 406 (e.g., etched through or formed by other processing techniques). Via 304 may electrically connect a bottom portion of the metallization and/or conductive layer of anode 410 (e.g., a portion of anode 410 located on a bottom side of substrate 402) with the top portion of the metallization and/or conductive layer of anode 410. In this case, the metallization and/or conductive layer of anode 410 may be formed in via 304 (e.g., on the sidewalls of via 304) such that the bottom portion of anode 410 electrically connects to the top portion of anode 410 in via 304, and such that current flows from the bottom portion of anode 410 to the top portion of anode 410. In this way, anode 410 extends from the bottom side of substrate 402 to the top side of substrate 402 and epitaxial layers 404 and 406.

In some implementations, via 304 may be a backside or bottom side via in that via 304 may be etched through substrate 402 from the backside or bottom side of substrate 402. In some implementations, via 304 may be a top side via in that via 304 may be etched through substrate 402 from the top side of substrate 402. Via 304 may also be formed by other methods.

In some cases, the metallization of the sidewalls in vias 304, and the semiconducting or conducting nature of epitaxial layers 404 and 406, may cause shorting between electrodes of VCSELs 302 of device 300. For example, electrical current may horizontally or laterally traverse or flow from anode 410 in via 304 through epitaxial layers 404 and 406 and/or through other layers of device 300 to cathode 412 (e.g. without, or with reduced, electrical current passing through VCSELs 102).

Accordingly, and as shown in FIG. 4B, device 300 may include an isolator 408 between the metallization and/or conductive layer of anode 410 and epitaxial layers 404 and 406. Isolator 408 may include a layer, a structure, a material, and/or the like that provides horizontal or lateral electrical isolation between anode 410 and cathode 412 to prevent current flow or shorting through epitaxial layers 404 and 406 thereby encouraging current flow through VCSELs 102. Moreover, device 300 may include a gap 414 between the bottom portion of anode 410 and cathode 412 on the bottom side of substrate 402 to electrically isolate anode 410 and cathode 412 in order to prevent shorting between anode 410 and cathode 412 (e.g. reduce potential for shorting the two electrodes when device 400 is attached to a package).

In some implementations, isolator 408 may be formed on the sidewalls of via 304, may be formed on at least a portion of the bottom of substrate 402, and/or the like. For example, isolator 408 may be formed between anode 410 and epitaxial layers 404 and 406 anywhere anode 410 is formed in via 304 (e.g., in a portion of via 304). In some implementations, isolator 408 may extend along a side of VCSELs 302 (e.g., along the side of a VCSEL 302, along a side of a VCSEL array including VCSELs 302, and/or the like) and a side of epitaxial layers 404 and 406.

In some implementations, isolation layer 408 may be deposited on epitaxial layers 404 and 406, may be grown on epitaxial layers 404 and 406, may be implanted in epitaxial layers 404 and 406, and/or may be formed by other processing techniques. In some implementations, isolation layer 408 may be formed by an implantation technique that includes using protons or ions, such as hydrogen ions, hydrogen protons, boron ions, oxygen ions, and/or the like, to damage or change an area of epitaxial layers 404 and 406. The implantation technique may change or damage an area of epitaxial layers 404 and 406 so that the area of epitaxial layers 404 and 406 is no longer electrically conductive (e.g., may form a highly electrically resistive area, a non-conductive area, a poorly conductive area. and/or the like).

In some implementations, isolator 408 may be formed of various non-conductive materials and/or insulating materials, such as a dielectric material, a polymer, a passivated semiconductor, and/or the like. In some implementations, the dielectric material may include silicon nitride, silicon dioxide, aluminum oxide, and/or other dielectric materials.

In some implementations, the polymer may include a polyamide, a benzocyclobutene polymer, and/or other types of polymers.

In some implementations, via 306 may be etched through substrate 402 and one or more of the epitaxial layers 404 and 406. Via 306 may electrically connect a bottom portion of the metallization and/or conductive layer of cathode 412 (e.g., a portion of cathode 412 located on the bottom side of substrate 402) with a top portion of the metallization and/or conductive layer of cathode 412 (e.g., a portion of cathode 412 located on the top side of substrate 402). In this case, the metallization and/or conductive layer of cathode 412 may be formed in via 306 (e.g., on the sidewalls of via 306) such that the bottom portion of cathode 412 electrically connects to the top portion of cathode 412 in via 306, and such that current flows from the top portion of cathode 412 to the bottom portion of cathode 412. In this way, cathode 412 is extend from the bottom side of substrate 402 to the top side of substrate 402 and one or more of epitaxial layers 404 and 406 through via 306.

In some implementations, via 306 may be a backside or bottom side via in that via 306 may be etched through substrate 402 from the backside or bottom side of substrate 402. In some implementations, via 306 may be top side via in that via 306 may be etched through substrate 402 from the top side of substrate 402.

In some cases, the metallization of the sidewalls in vias 306, and the semiconducting or conducting nature of p-doped epitaxial layers 406, may cause shorting between electrodes of VCSELs 302 of device 300. For example, electrical current may horizontally or laterally traverse or flow from anode 410 through p-doped epitaxial layers 406 to cathode 312 without flowing through VCSELs 302 and to n-doped epitaxial layers 404. As a result, electrical current may not flow through VCSELs 302, which may prevent VCSELs 302 from emitting light 416 or may cause light 416 to be emitted at a reduced power.

Accordingly, and as shown in FIG. 4C, device 300 may include area 308 in which p-doped epitaxial layers 406 are removed to prevent current flow or shorting directly from p-doped epitaxial layers 406 to cathode 412 at the top portion of cathode 412 on the top side of substrate 402.

In this way, anode 410 and cathode 412 may be located on the bottom side of substrate 402 of device 300. Via 304 may extend anode 410 from the bottom side of substrate 402 to the top side of substrate 402 and epitaxial layers 404 and 406. Isolator 408 may be formed on at least a portion of the walls of via 304 to electrically isolate anode 410 from cathode 412 and epitaxial layers 404 and 406 in order to reduce or prevent horizontal or lateral conduction through epitaxial layers 404 and 406 between anode 410 in via 304 and cathode 412.

Moreover, via 306 may extend cathode 412 from the bottom side of substrate 402 to the top side of substrate 402 and one or more of epitaxial layers 404 and 406 to connect via 306 to n-doped epitaxial layer 404. This permits a portion of cathode 412 (e.g., which may correspond to n-doped epitaxial layer 404) to be included between a VCSEL 302 and substrate 402.

In this way, device 300 may be electrically connected to a package by directly bonding anode 410 and cathode 210 to a modular substrate the package where device 300 includes a non-conductive and/or insulating substrate. The direct bonding permits device 300 to be electrically connected to the package without wire bonds, which may decrease the size of the overall packaged device 300, may decrease rise and fall times of VCSELs 302 included in device 300 under short pulsed operation, may decrease the complexity of packaged device 300, may increase the reliability of packaged device 300, and/or the like.

As indicated above, FIGS. 3 and 4A-4C are provided merely as one or more examples. Other examples are contemplated and may differ from what is described with regard to FIGS. 3 and 4A-4C. For example, while FIGS. 3 and 4A-4C are described in connection with VCSELs, the example implementations described in connection with FIGS. 3 and 4A-4C may include vertical-emitting LEDs and/or other types of vertical-emitting devices, may include vertical-emitting LED arrays and/or other types of vertical-emitting device arrays, and/or the like. As another example, the example implementations described in connection with FIGS. 3 and 4A-4C may include a single VCSEL or a plurality of VCSELs (which may be included in one or more VCSEL arrays), may include a single via or a plurality of vias (which may be included in one or more via arrays), and/or the like.

Figure 5:
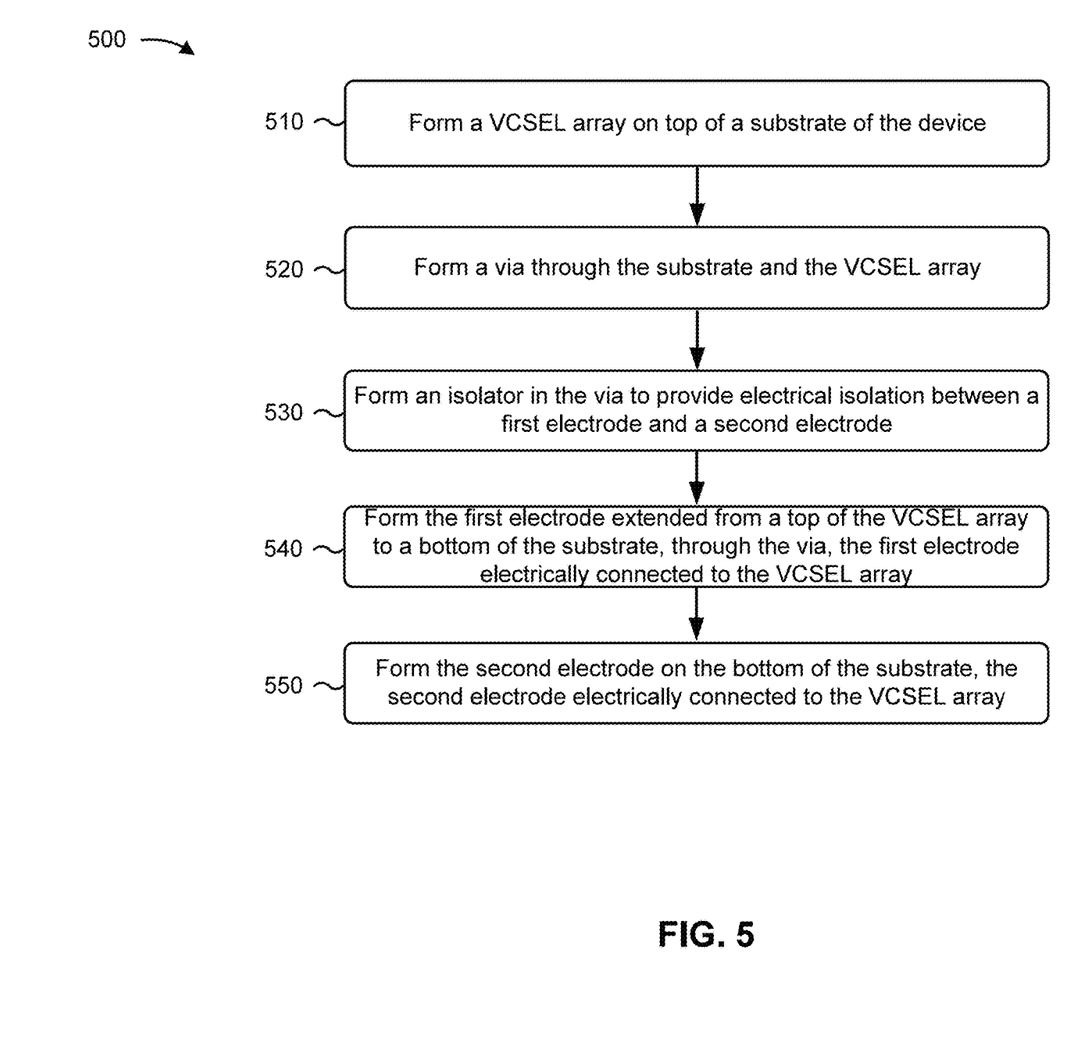
FIG. 5 is a flow chart of an example process for forming a device.

FIG. 5 is a flow chart of an example process 500 for forming a device. The device may include, for example, device 100 illustrated and described above in connection with FIGS. 1, 2A, and 2B, device 300 illustrated and described above in connection with FIGS. 3 and 4A-4C, and/or the like.

As shown in FIG. 5, process 500 may include forming a VCSEL array on top of a substrate of the device (block 510). For example, process 500 may include forming a VCSEL (e.g., VCSEL 102, VCSEL 302, and/or the like), as described above. In some implementations, forming the VCSEL array may include forming a substrate (e.g., substrate 202, substrate 402, and/or the like) of a device (e.g., device 100, device 300, and/or the like), forming one or more epitaxial layers (e.g., epitaxial layers 204, epitaxial layers 406, and/or the like) on the substrate, and forming a plurality of VCSEL in the one or more epitaxial layers in an array. In some implementations, the plurality of VCSELs may be electrically connected to the anode and the cathode in parallel.

As further shown in FIG. 5, process 500 may include forming a via through the substrate and the VCSEL array (block 520). For example, process 500 may include forming a via (e.g., via 104, via 304, and/or the like), as described above. In some implementations, forming the via may include etching the via through the substrate and the one or more epitaxial layers. In some implementations, forming the via may include etching the via from a bottom side of the substrate. In some implementations, forming the via may include etching the via from a top side of the substrate. In some implementations, process 500 may further comprise forming another via (e.g., via 306) through the substrate to extend a cathode (e.g., cathode 412) of the device, electrically connected to the VCSEL, from the top side of the substrate to the bottom side of the substrate.

As further shown in FIG. 5, process 500 may include forming an isolator in the via to provide electrical isolation between a first electrode and a second electrode (block 530). For example, process 500 may include forming an isolator (e.g., isolator 206, isolator 408, and/or the like) in at least a portion of the via and on at least a portion of a bottom side of the substrate, as described above. In some implementations, forming the isolator may include forming the isolator by a deposition technique, by growing the isolator, by an implantation technique, and/or the like.

As further shown in FIG. 5, process 500 may include forming the first electrode extended from a top of the VCSEL array to a bottom of the substrate, through the via, the first electrode electrically connected to the VCSEL array (block 540). For example, process 500 may include forming an anode (e.g., anode 208, anode 410, and/or the like) extended from a top of the VCSEL array to a bottom of the substrate, through the via, the first electrode electrically connected to the VCSEL array, as described above. In some implementations, process 500 may further comprise electrically connecting the anode to a package at the bottom side of the substrate. In some implementations, the VCSEL array is electrically connected to the anode in parallel.

As further shown in FIG. 5, process 500 may include forming the second electrode on the bottom of the substrate, the second electrode electrically connected to the VCSEL array (block 550). In some implementations, forming the second electrode may include forming a cathode (e.g., cathode 210, cathode 412, and/or the like). In some implementations, the cathode may be extended from a top of the VCSEL array to a bottom of the substrate through another via (e.g. via 306). In some implementations, process 500 may further comprise electrically connecting the cathode to a package at the bottom side of the substrate. In some implementations, the VCSEL array is electrically connected to the cathode in parallel.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations described herein relate to VCSELs, VCSEL devices, VCSEL chips, VCSEL arrays, emitters, vias, isolator, and/or the like. In some implementations, the VCSELs, VCSEL chips, VCSEL arrays, emitters, vias, isolator, and/or the like described herein may be used for three-dimensional sensing applications.

The number, arrangement, thicknesses, order, symmetry, and/or the like, of layers shown in the figures and/or described herein are provided as examples. In practice, emitter arrays and/or vertical-emitting devices shown in the figures and/or described herein may include additional layers, fewer layers, different layers, differently constructed layers, or differently arranged layers than those shown in the figures and/or described herein. Additionally, or alternatively, a set layers (e.g., one or more layers) of an emitter array and/or a vertical-emitting device may perform one or more functions described as being performed by another set of layers of the emitter array and/or the vertical-emitting device.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   a substrate;
   a vertical cavity surface emitting laser (VCSEL) array on top of the substrate;
   a via through the substrate and the VCSEL array;
   a first electrode extended from a top of the VCSEL array to a bottom of the substrate, through the via, the first electrode electrically connected to the VCSEL array;
   a second electrode on the bottom of the substrate, the second electrode electrically connected to the VCSEL array;
   an isolator in the via providing electrical isolation between the first electrode and the second electrode; and
   a gap between the first electrode and the second electrode on the bottom of the substrate.

2. The device of claim 1, wherein the isolator extends along a side of the VCSEL array and a side of the substrate through the via and over a portion of the bottom of the substrate.

3. The device of claim 1, wherein the isolator extends along a side of the VCSEL array and a portion of a side of the substrate adjacent to the via.

4. The device of claim 1, wherein the isolator comprises an implant within a side of the VCSEL array and at least a portion of a side of the substrate adjacent to the via.

5. The device of claim 1, wherein the second electrode is located between the VCSEL array and the substrate and extends through a second via to the bottom of the substrate.

6. The device of claim 1, wherein the first electrode is an anode; and
   wherein the second electrode is a cathode.

7. The device of claim 1, wherein the first electrode is a shared electrode for all emitters of the VCSEL array.

8. The device of claim 1, wherein the second electrode is a common electrode for all emitters of the VCSEL array.

9. The device of claim 1, further comprising:
   a second via through the substrate and the VCSEL array, wherein the second electrode extends from the top of the VCSEL array to the bottom of the substrate through the second via.

10. A device, comprising:
    a non-conductive substrate;
    a vertical cavity surface emitting laser (VCSEL) array on top of the non-conductive substrate;
    a first via through the non-conductive substrate and the VCSEL array;
    a second via through the non-conductive substrate and the VCSEL array;
    a first electrode extended from a top of the VCSEL array to a bottom of the non-conductive substrate, through the first via, the first electrode electrically connected to the VCSEL array;
    a second electrode extended from the top of the VCSEL array to the bottom of the non-conductive substrate, through the second via, the second electrode electrically connected to the VCSEL array; and an isolator in the first via providing electrical isolation between the first electrode and the second electrode.

11. The device of claim 10, wherein the first electrode is a shared electrode for all emitters of the VCSEL array; and wherein the second electrode is a common electrode for all emitters of the VCSEL array.

12. The device of claim 10, wherein the isolator extends along a side of the VCSEL array and a side of the nonconductive substrate through a portion of the via.

13. The device of claim 10, wherein the second electrode is isolated from the first electrode on the top of the nonconductive substrate.

14. A method of forming a device, comprising:

forming a vertical cavity surface emitting laser (VCSEL) array on top of a substrate of the device;

forming a via through the substrate and the VCSEL array;

forming an isolator in the via to provide electrical isolation between a first electrode and a second electrode;

forming the first electrode extended from a top of the VCSEL array to a bottom of the substrate, through the via, the first electrode electrically connected to the VCSEL array;

forming the second electrode on the bottom of the substrate, the second electrode electrically connected to the VCSEL array; and forming a gap between the first electrode and the second electrode on the bottom of the substrate.

15. The method of claim 14, wherein forming the via through the substrate comprises:

etching the via from the bottom of the substrate.

16. The method of claim 14, wherein forming the via through the substrate comprises:

etching the via from the top of the substrate.

17. The method of claim 14, further comprising:

forming one or more epitaxial layers on the substrate; and wherein forming the via through the substrate comprises:

etching the via through the substrate and the one or more epitaxial layers.

18. The method of claim 14, further comprising:

forming a second via through the substrate and the VCSEL array, the second electrode extending from the top of the VCSEL array to the bottom of the substrate through the second via.

19. The method of claim 14, further comprising:

electrically connecting the first electrode to a package at the bottom of the substrate; and electrically connecting the second electrode to the package at the bottom of the substrate.

20. The method of claim 14, wherein forming the VCSEL array on the substrate of the device comprises:

forming a plurality of emitters in a VCSEL array on the substrate of the device, wherein the plurality of emitters are electrically connected to the first electrode and the second electrode in parallel.

* * * * *